United States Patent
Condo et al.

(10) Patent No.: US 11,323,139 B2
(45) Date of Patent: May 3, 2022

(54) APPARATUSES AND METHODS FOR MAPPING FROZEN SETS BETWEEN POLAR CODES AND PRODUCT CODES

(71) Applicant: Huawei Technologies Co., Ltd., Shenzhen (CN)

(72) Inventors: Carlo Condo, Munich (DE); Valerio Bioglio, Boulogne Billancourt (FR); Ingmar Land, Boulogne Billancourt (FR)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/201,891

(22) Filed: Mar. 15, 2021

(65) Prior Publication Data

US 2021/0203364 A1    Jul. 1, 2021

Related U.S. Application Data

(63) Continuation of application No. PCT/EP2018/074796, filed on Sep. 13, 2018.

(51) Int. Cl.
*H03M 13/00* (2006.01)
*H03M 13/13* (2006.01)
*H03M 13/29* (2006.01)

(52) U.S. Cl.
CPC ......... *H03M 13/616* (2013.01); *H03M 13/13* (2013.01); *H03M 13/2909* (2013.01); *H03M 13/2927* (2013.01)

(58) Field of Classification Search
CPC ............... H03M 13/13; H03M 13/616; H03M 13/2906; H03M 13/2909; H03M 13/2927
See application file for complete search history.

(56) References Cited

U.S. PATENT DOCUMENTS

| 2017/0155405 A1* | 6/2017 | Ge | ........................ H03M 13/13 |
| 2017/0214416 A1* | 7/2017 | Ge | ........................ H03M 13/09 |

(Continued)

OTHER PUBLICATIONS

Koike-Akino Toshiaki et al., "Irregular Polar Turbo Product Coding for High-Throughput Optical Interface," 2018 Optical Fiber Communications Conference and Exposition (OFC), OSA, XP033357478, total 3 pages (Mar. 2018).

(Continued)

*Primary Examiner* — Albert Decady
*Assistant Examiner* — Enamul M Kabir
(74) *Attorney, Agent, or Firm* — Leydig, Voit & Mayer, Ltd.

(57) ABSTRACT

A method generates a frozen vector associated with a polar code codeword on the basis of a frozen matrix associated with a product code codeword, the frozen matrix being of size $N_c \times N_r$. The method includes replicating a first matrix row of the frozen matrix $N_c$ times to generate an expanded matrix row; replicating a first matrix column of the frozen matrix $N_r$ times to generate an expanded matrix column; generating the frozen vector on the basis of the expanded matrix row and the expanded matrix column. The disclosure further provides a method for generating a frozen matrix associated with a product code codeword on the basis of a frozen vector associated with a polar code codeword, wherein the product code codeword comprises a matrix of size $N_c \times N_r$, and the frozen vector comprises a vector of size N with a plurality of bits.

18 Claims, 7 Drawing Sheets

(56) References Cited

U.S. PATENT DOCUMENTS

| | | | | |
|---|---|---|---|---|
| 2018/0226999 A1* | 8/2018 | Wang | .................... | H04L 1/0064 |
| 2018/0351581 A1* | 12/2018 | Presman | ............... | H04L 1/0057 |
| 2019/0036550 A1* | 1/2019 | Koike-Akino | ..... | H03M 13/1108 |

OTHER PUBLICATIONS

Arikan et al., "Channel Polarization: A Method for Constructing Capacity-Achieving Codes for Symmetric Binary-nput Memoryless Channels," IEEE Transactions on Information Theory, vol. 55, No. 7, pp. 3051-3073, Institute of Electrical and Electronics Engineers, New York, New York (Jul. 2009).

Sarkis et al., "Flexible and Low-Complexity Encoding and Decoding of Systematic Polar Codes," XP055336370, IEEE Transactions on Communications, total 13 pages, Institute of Electrical and Electronics Engineers, New York, New York (Feb. 23, 2016).

Elias, "Error-free coding," Trans. IRE Prof. Group Inf. Theory, vol. 4, No. 4, pp. 29-37 (Sep. 1954).

Vangala et al.,"A New Multiple Folded Successive Cancellation Decoder for Polar Codes," 2014 IEEE Information Theory Workshop (ITW 2014), IEEE, XP032694569, total 5 pages (Nov. 2014).

T. Koike-Akino et al., "Irregular Polar Turbo Product Coding for High-Throughput Optical Interface," in Optical Fiber Communication Conference and Exhibition (OFC), San Diego, CA, USA, total 5 pages (Mar. 2018).

R. M. Pyndiah et al.,"Near-Optimum Decoding of Product Codes: Block Turbo Codes," IEEE Transactions on Communications, vol. 46, No. 8, pp. 1003-1010, Institute of Electrical and Electronics Engineers, New York, New York (Aug. 1998).

Bioglio et al., "Minimum-Distance Based Construction of Multi-Kernel Polar Codes," IEEE Globecom 2017, total 6 pages (2017).

Gabry et al.,"Multi-Kernel Construction of Polar Codes," 2017 IEEE International Conference on Communications Workshops (ICC Workshops), Paris, 2017, total 5 pages (2017).

Tal et al., "List Decoding of Polar Codes," IEEE Transactions on Information Theory, vol. 61, No. 5, pp. 1-11 (May 31, 2012).

K. Niu et al., "Stack decoding of polar codes," Electronics Letters, vol. 48, No. 12, total 2 pages (2012).

Afisiadis et al., "A Low-Complexity Improved Successive Cancellation Decoder for Polar Codes," in Asilomar Conf. on Signals, Syst., and Comput., pp. 2116-2120 (Nov. 2014).

Arikan, "Polar codes: A pipelined implementation," Proc. Int. Symp. Broadband Communication (ISBC2010), pp. 1-3 (Jul. 2010).

U. U. Fayyaz et al., "Low-Complexity Soft-Output Decoding of Polar Codes," IEEE Journal on Selected Areas in Communications, vol. 32, No. 5, pp. 958-966 (May 2014).

* cited by examiner

APPARATUSES AND METHODS FOR MAPPING FROZEN SETS BETWEEN POLAR CODES AND PRODUCT CODES

CROSS-REFERENCE TO RELATED APPLICATIONS

This application is a continuation of International Application No. PCT/EP2018/074796, filed on Sep. 13, 2018, the disclosure of which is hereby incorporated by reference in its entirety.

FIELD

Generally, the present disclosure relates to the field of channel coding. More specifically, the present disclosure relates to apparatuses and corresponding methods for mapping frozen sets between polar codes and product codes.

BACKGROUND

Channel codes are essential in all digital communications systems. A system for forward error correction (FEC) coding, also called a coding scheme, consists of an encoder at the transmitter side and a decoder at the receiver side. The encoder adds redundancy to the data to be transmitted, i.e. additional redundant data, and the decoder exploits this redundancy to correct transmission errors, such that the receiver obtains the transmitted data free of errors despite the noisy communication channel. FIG. 1 shows such a communication system 100, wherein the data u to be transmitted, termed information word, is given to an encoder 101, which produces the codeword x containing redundancy. This is then transmitted over a noisy communication channel 103 which typically introduces errors. The output vector y is provided to a decoder 105, which produces estimates of the transmitted codeword and the transmitted data. The set C of possible codewords is called the code, or channel code, and the following is concerned with such a code.

Polar codes are linear block codes that rely on the polarization effect, which allows to sort the bit positions of u, called bit-channels, in order of reliability. As the code length goes toward infinity, the polarization phenomenon influences the reliability of bit-channels, which are either completely noisy or completely noiseless. Furthermore, the fraction of noiseless bit-channels equals the channel capacity. More details about polar codes can be found in E. Arikan, "Channel polarization: A method for constructing capacity achieving codes for symmetric binary-input memoryless channels," IEEE Transactions on Information Theory, vol. 55, no. 7, pp. 3051, July 2009.

For finite practical code lengths, the polarization of bit-channels is incomplete; therefore, there are bit-channels that are partially noisy. The polar encoding process consists in the classification of the bit-channels in u into two groups: the K good bit-channels that will carry the information bits and are indexed by the information set I, and the N-K bad bit-channels that are fixed to a predefined value (usually 0) and are indexed by the frozen set F. In case of finite code lengths, the K best bit-channels, i.e. the ones with the highest reliability, are selected to form the information set, while the remaining bit-channels are frozen. The frozen set F is available to both the encoder and decoder (see FIG. 1).

Arikan polar codes are based on the kernel matrix $$T_2 = \begin{bmatrix} 1 & 0 \\ 1 & 1 \end{bmatrix}.$$

Encoding of such a polar code of length $N=2^n$ and information length K is as follows. The frozen set F of size N-K is chosen, as described above. The bits $u_i$ of the input vector u are set to 0 for $i \in F$ and to the information bits otherwise. The codeword x is computed as $x=uT$ with the transformation matrix $T=T_2^{\otimes n}$, denoting the n-fold Kronecker product. As a generalization, different kernels may be used and frozen sets may be defined in alternative ways.

Most polar code decoding algorithms are based on the Successive Cancellation (SC) decoding algorithm, which is inherently sequential. It can be viewed as a binary tree search, where bits are estimated at leaf nodes, and the tree is traversed depth-first, with priority given to the left branch. In SC decoding, the decoder starts with a decision for bit $u_1$ and feeds this decision back into the decoding process; then it makes a decision of bit $u_2$ and feeds this decision back into the decoding process; it proceeds in this fashion until it obtains the design for the last bit $u_N$. Besides plain SC decoding, also SC list decoding, SC stack decoding, or similar decoding algorithms may be applied.

Product codes are a class of error-correction codes constructed by encoding a matrix of information symbols row-wise with a row component code, and subsequently column-wise using a column component code, as depicted in FIG. 2. The twofold encoding acts as a concatenation of the row and column component codes. In a generalized product code, different component codes may be used for the rows, and different component codes may be used for the columns.

Polar product codes have been proposed in T. Koike-Akino et. al., "Irregular polar turbo product coding for high-throughput optical interface," in Optical Fiber Communication Conference and Exhibition, 2018, wherein systematic polar codes are used as component codes.

In a product code, information bits are arranged in a $K_c \times K_r$ array, then code $C_r$ is used to encode the $K_c$ rows independently. Afterwards, the $N_r$ columns obtained in the previous step are encoded using code $C_c$. The result is an $N_c \times N_r$ array, where rows are codewords of code $C_r$ and columns are codewords of code $C_c$. Product codes can be decoded by sequentially decoding row and column component codes. A product code decoder typically decodes first all the row codewords, which can be done in parallel. Using the results of the row-decoding, the decoder next decodes all the column codewords, which can be done in parallel. The decoder proceeds in this fashion for a certain number of iterations and produces the estimates of the transmitted bits. Soft-input/soft-output decoders are normally used to improve the decoding performance by iterating the decoding of rows and columns and exchanging soft information between the two decoders.

Product codes can be decoded with a high degree of parallelism, but good error correction performance comes at the cost of complex soft-in-soft-out decoding. Polar code decoding, on the other hand, suffers from long decoding latency, due to the sequential nature of SC-based decoding.

To decode a polar code codeword or a product code codeword efficiently, polar codes can be interpreted as product codes and product codes with polar component codes can be interpreted as polar codes. In an alternative interpretation, the frozen set is to be mapped from the one used for the encoding process. In case of hybrid decoding approaches that combine product and polar decoding, selection of a standard frozen set is suboptimal for one of the approaches.

In light of the above, there is still a need for improved apparatuses and corresponding methods allowing, for example, for mapping frozen sets between polar codes and product codes more efficiently.

SUMMARY

Embodiments of the present application provide improved apparatuses and corresponding methods allowing, for example, for mapping frozen sets between polar codes and product codes more efficiently.

Generally, embodiments of the disclosure address the problem of how to map a frozen set used for encoding a product polar code to the polar code, and vice versa. It also describes a frozen set selection criterion for hybrid decoding approaches that combine both product and polar decoding.

More specifically, according to a first aspect the disclosure relates to a mapping apparatus for generating a frozen vector associated with a polar code codeword on the basis of a frozen matrix associated with a product code codeword, the frozen matrix being of size $N_c \times N_r$, the frozen matrix comprising a plurality of bits, wherein the mapping apparatus comprises a processing unit configured to: replicate a first matrix row of the frozen matrix $N_c$ times to generate an expanded matrix row; replicate a first matrix column of the frozen matrix $N_r$ times to generate an expanded matrix column; generate the frozen vector on the basis of the expanded matrix row and the expanded matrix column, wherein a respective bit value of the frozen vector equals 1 if a respective corresponding bit of the expanded matrix row or a further respective corresponding bit of the expanded matrix column equals 1 and, otherwise, the respective bit value of the frozen vector equals 0.

Thus, an improved mapping apparatus is provided allowing, for example, for generating a frozen vector associated with a polar code codeword on the basis of a frozen matrix associated with a product code codeword in an efficient manner.

In a further possible implementation form of the first aspect, the processing unit is further configured to change at least one bit of the frozen vector that is not frozen into a frozen bit, wherein the at least one bit of the frozen vector is at a position at which a reliability of a corresponding bit of the polar code codeword is lower than a predetermined threshold value.

In a further possible implementation form of the first aspect, the processing unit is further configured to change at least one further bit of the frozen vector that is frozen into an information bit, wherein the at least one further bit of the frozen vector is at a position at which a reliability of a corresponding bit of the polar code codeword is higher than a predetermined threshold value.

According to a second aspect the disclosure relates to a method for generating a frozen vector associated with a polar code codeword on the basis of a frozen matrix associated with a product code codeword, the frozen matrix being of size $N_c \times N_r$, the frozen matrix comprising a plurality of bits, wherein the method comprises the following steps: replicating a first matrix row of the frozen matrix $N_c$ times to generate an expanded matrix row; replicating a first matrix column of the frozen matrix $N_r$ times to generate an expanded matrix column; and generating the frozen vector on the basis of the expanded matrix row and the expanded matrix column, wherein a respective bit value of the frozen vector equals 1 if a respective corresponding bit of the expanded matrix row or a further respective corresponding bit of the expanded matrix column equals 1 and, otherwise, the respective bit value of the frozen vector equals 0.

Thus, an improved method is provided allowing, for example, for generating a frozen vector associated with a polar code codeword on the basis of a frozen matrix associated with a product code codeword in an efficient manner.

According to a third aspect the disclosure relates to a decoding apparatus for decoding a product code codeword, wherein the decoding apparatus comprises: a mapping apparatus according to the first aspect for generating a frozen vector associated with a polar code codeword on the basis of a frozen matrix associated with the product code codeword; and a decoding unit configured to decode the product code codeword on the basis of the frozen vector associated with the polar code codeword using a polar code decoding scheme.

Thus, an improved decoding apparatus is provided allowing, for example, for a more efficient decoding of a product code codeword.

According to a fourth aspect the disclosure relates to a mapping apparatus for generating a frozen matrix associated with a product code codeword on the basis of a frozen vector associated with a polar code codeword, the product code codeword comprising a matrix of size $N_c \times N_r$, the frozen vector comprising a vector of size N, the vector comprising a plurality of bits, wherein the mapping apparatus comprises a processing unit configured to: generate a first vector of size $N_r$, wherein the first vector comprises a bit with a value of 1 at position k and multiple bits with a value of 0 at the other positions; expand the first vector on the basis of the $i^{th}$ row of a transpose of a transformation matrix associated with the polar-code codeword to generate a first expanded vector, the transformation matrix being of size $N_c \times N_c$; and determine a bit value of the frozen matrix at position k for the $i^{th}$ row on the basis of the first expanded vector and the frozen vector, wherein the bit value of the frozen matrix at position k for the $i^{th}$ row is a frozen bit, if, for each bit of the first expanded vector that comprises a bit value of 1, a respective corresponding bit of the frozen vector also equals 1.

In a further possible implementation form of the fourth aspect, the processing unit is further configured to expand the first vector by multiplying the first vector with each bit of the $i^{th}$ row of the transpose of the transformation matrix.

In a further possible implementation form of the fourth aspect, the processing unit is further configured to: generate a second vector of size $N_c$, wherein the second vector comprises a bit with a value of 1 at position k and multiple bits with a value of 0 at the other positions; expand the second vector on the basis of the $j^{th}$ row of a transpose of a further transformation matrix associated with the polar-code codeword to generate a second expanded vector, the further transformation matrix being of size $N_r \times N_r$; and determine a bit value of the frozen matrix at position k for the $j^{th}$ column on the basis of the second expanded vector and the frozen vector, wherein the bit value of the frozen matrix at position k for the $j^{th}$ column is a frozen bit, if, for each bit of the second expanded vector that comprises a bit value of 1, a respective corresponding bit of the frozen vector also equals 1.

In a further possible implementation form of the fourth aspect, the processing unit is further configured to expand the second vector to generate the second expanded vector by multiplying the $j^{th}$ row of the transpose of the further transformation matrix with each bit of the second vector.

Thus, an improved mapping apparatus is provided allowing, for example, for generating a frozen matrix associated with a product code codeword on the basis of a frozen vector associated with a polar code codeword in an efficient manner.

In a further possible implementation form of the fourth aspect, the processing unit is further configured to change at least one bit of the frozen matrix that is not frozen into a frozen bit, wherein the at least one bit of the frozen matrix is at a position at which a reliability of a corresponding bit of the product code codeword is lower than a predetermined threshold value.

In a further possible implementation form of the fourth aspect, the processing unit is further configured to change at least one further bit of the frozen matrix that is frozen into an information bit, wherein the at least one further bit of the frozen matrix is at a position at which a reliability of a corresponding bit of the product code codeword is higher than a predetermined threshold value.

According to a fifth aspect the disclosure relates to a method for generating a frozen matrix associated with a product code codeword on the basis of a frozen vector associated with a polar code codeword, the product code codeword comprising a matrix of size $N_c \times N_r$, the frozen vector comprising a vector of size N, the vector comprising a plurality of bits, wherein the method comprises the following steps: generating a first vector of size $N_r$, wherein the first vector comprises a bit with a value of 1 at position k and multiple bits with a value of 0 at the other positions; expanding the first vector on the basis of the $i^{th}$ row of a transpose of a transformation matrix associated with the polar-code codeword to generate a first expanded vector, the transformation matrix being of size $N_c \times N_c$; and determining a bit value of the frozen matrix at position k for the $i^{th}$ row on the basis of the first expanded vector and the frozen vector, wherein the bit value of the frozen matrix at position k for the $i^{th}$ row is a frozen bit, if, for each bit of the first expanded vector that comprises a bit value of 1, a respective corresponding bit of the frozen vector also equals 1.

In a further possible implementation form of the fifth aspect, the method further comprises the following steps: generating a second vector of size $N_c$, wherein the second vector comprises a bit with a value of 1 at position k and multiple bits with a value of 0 at the other positions; expanding the second vector on the basis of the $j^{th}$ row of a transpose of a further transformation matrix associated with the polar-code codeword to generate a second expanded vector, the further transformation matrix being of size $N_r \times N_r$; and determining a bit value of the frozen matrix at position k for the $j^{th}$ column on the basis of the second expanded vector and the frozen vector, wherein the bit value of the frozen matrix at position k for the $j^{th}$ column is a frozen bit, if, for each bit of the second expanded vector that comprises a bit value of 1, a respective corresponding bit of the frozen vector also equals 1.

Thus, an improved method is provided allowing, for example, for generating a frozen matrix associated with a product code codeword on the basis of a frozen vector associated with a polar code codeword in an efficient manner.

According to a sixth aspect the disclosure relates to a decoding apparatus for decoding a polar code codeword, wherein the decoding apparatus comprises: a mapping apparatus according to the fourth aspect for generating a frozen matrix associated with a product code codeword on the basis of a frozen vector associated with the polar code codeword; and a decoding unit configured to decode the polar code codeword on the basis of the frozen matrix associated with the product code codeword using a product code decoding scheme.

Thus, an improved decoding apparatus is provided allowing, for example, for a more efficient decoding of a polar code codeword.

According to a seventh aspect the disclosure relates to a computer program comprising program code for performing the method according to the second aspect or the method according to fifth aspect when executed on a computer.

The disclosure can be implemented in hardware and/or software.

BRIEF DESCRIPTION OF THE DRAWINGS

Further embodiments of the disclosure will be described with respect to the following figures, wherein.

In the various figures, identical reference signs will be used for identical or at least functionally equivalent features.

DETAILED DESCRIPTION

In the following description, reference is made to the accompanying drawings, which form part of the disclosure, and in which are shown, by way of illustration, specific aspects in which the present disclosure may be placed. It is understood that other aspects may be utilized and structural or logical changes may be made without departing from the scope of the present disclosure. The following detailed description, therefore, is not to be taken in a limiting sense, as the scope of the present disclosure is defined be the appended claims.

For instance, it is understood that a disclosure in connection with a described method may also hold true for a corresponding device or system configured to perform the method and vice versa. For example, if a specific method step is described, a corresponding device may include a unit to perform the described method step, even if such unit is not explicitly described or illustrated in the figures. Further, it is understood that the features of the various exemplary aspects described herein may be combined with each other, unless specifically noted otherwise.

As will be described in more detail in the following, embodiments of the disclosure allow for inferring a frozen set of the polar code from that of component codes, and vice versa. Embodiments of the disclosure offer in particular the advantages of tuning the latency and error-correction performance towards a desired trade-off when both decoding approaches are applied.

Figure 1:
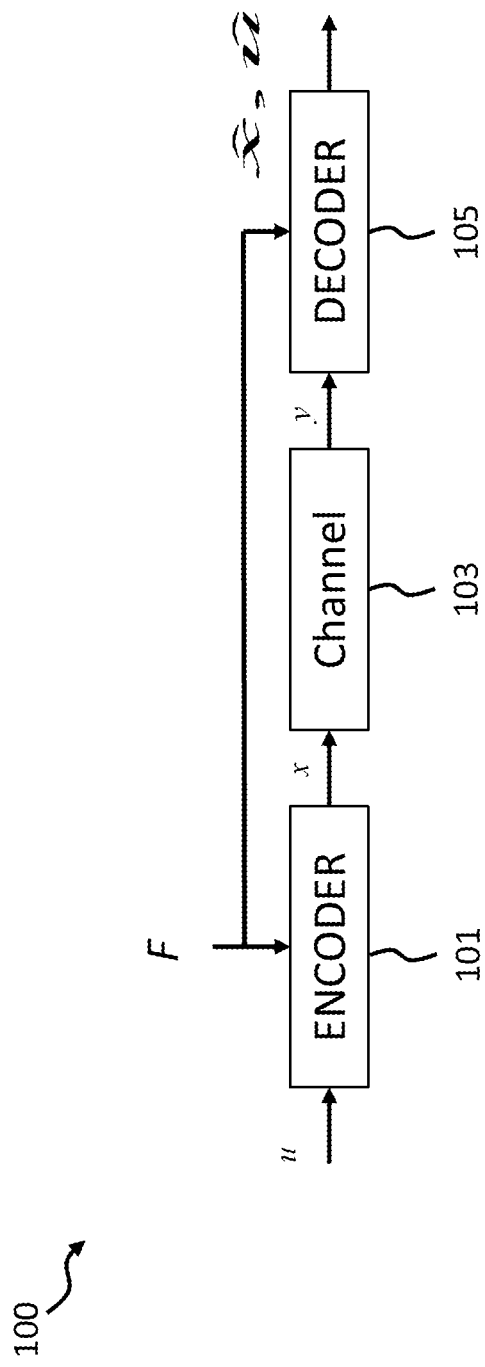
FIG. 1 shows a schematic diagram illustrating a communication system comprising an encoder, a communication channel and a decoder.
Figure 2:
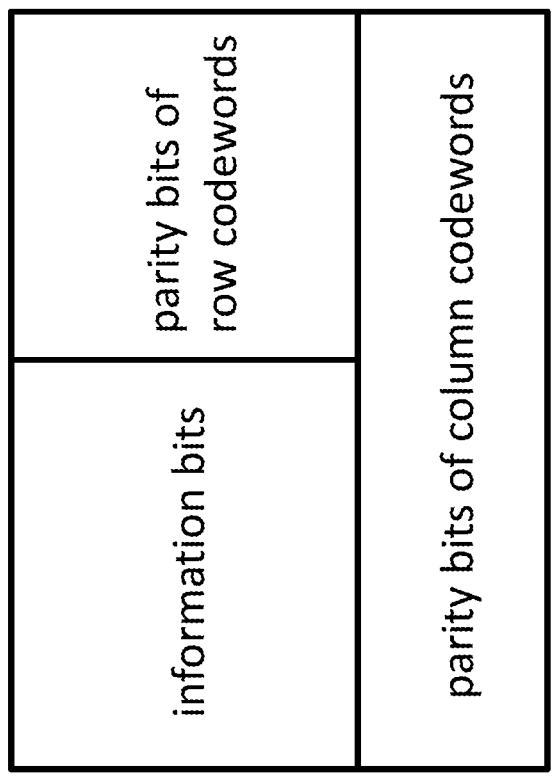
FIG. 2 shows a schematic diagram illustrating an encoding scheme of a product code.
Figure 3:
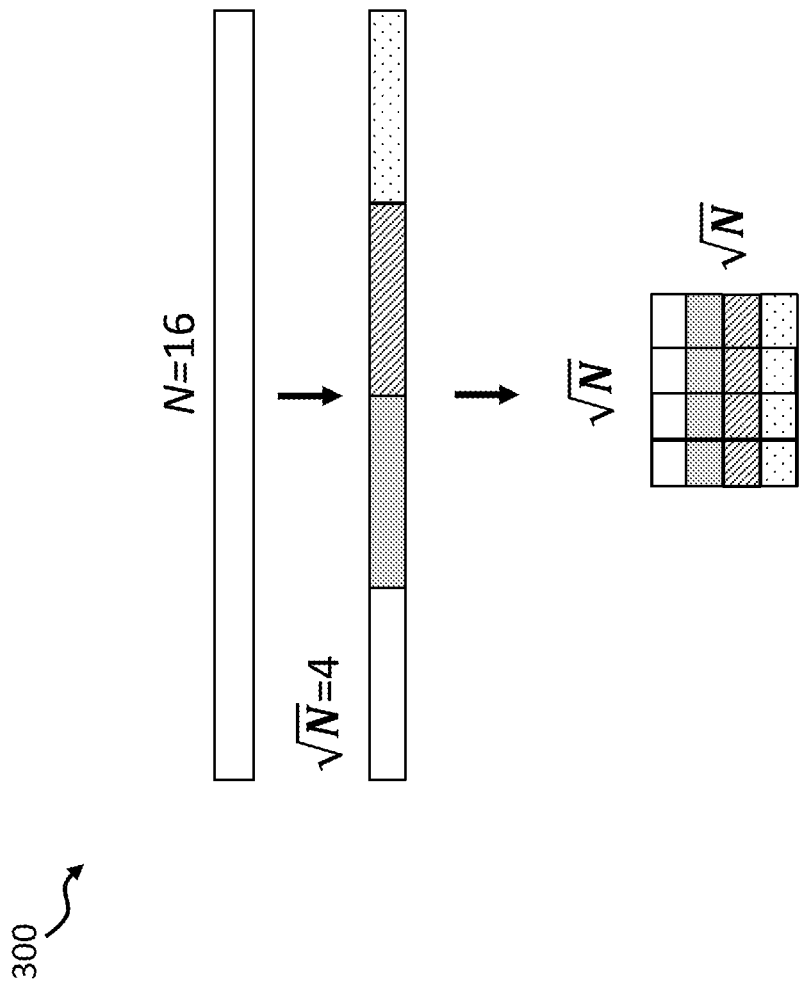
FIG. 3 shows a schematic diagram illustrating conversion of polar code to product code performed by a decoder according to an embodiment.

FIG. 3 illustrates an exemplary conversion 300 of polar code to product code performed by a decoder which will be further described below under reference to FIG. 5. This conversion 300 may also be used in an encoder. Given a polar code of length N, a codeword x can be split in $\sqrt{N}$ sections of length $\sqrt{N}$ each and the sections can be rearranged one below the other. The resulting $\sqrt{N} \times \sqrt{N}$ matrix is a non-systematic product code matrix where each row and each column is a valid polar codeword of length $\sqrt{N}$. FIG. 3 illustrates an example 300 of a polar code codeword for N=16. This applies even with sections of length different from $\sqrt{N}$; the resulting matrix $N_r \times N_c$ is rectangular, but still this property applies.

Given the fact that a polar code can be decoded as a product code and vice versa, the frozen set used by one encoding approach needs to be mapped to the frozen set used by the other. Embodiments of the disclosure can perform this two-way mapping and a mixed frozen set selection criterion, which is useful for error-correction performance and latency trade-off in case the two decoding approaches are combined.

To allow different trade-offs in terms of decoding speed, complexity and error-correction performance, embodiments of the disclosure allow for the design of a novel frozen set F', which can be viewed as an intermediate choice between the optimal frozen set for product decoding and the optimal frozen set for standard polar decoding.

Figure 4:
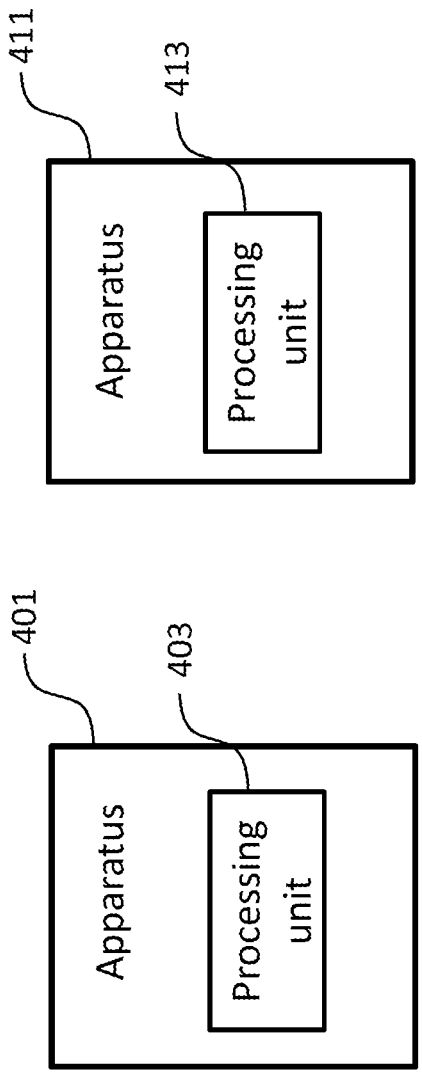
FIG. 4 shows a schematic diagram illustrating a mapping apparatus according to an embodiment for generating a frozen vector associated with a polar code codeword and a mapping apparatus according to an embodiment for generating a frozen matrix associated with a product code codeword.
Figure 5:
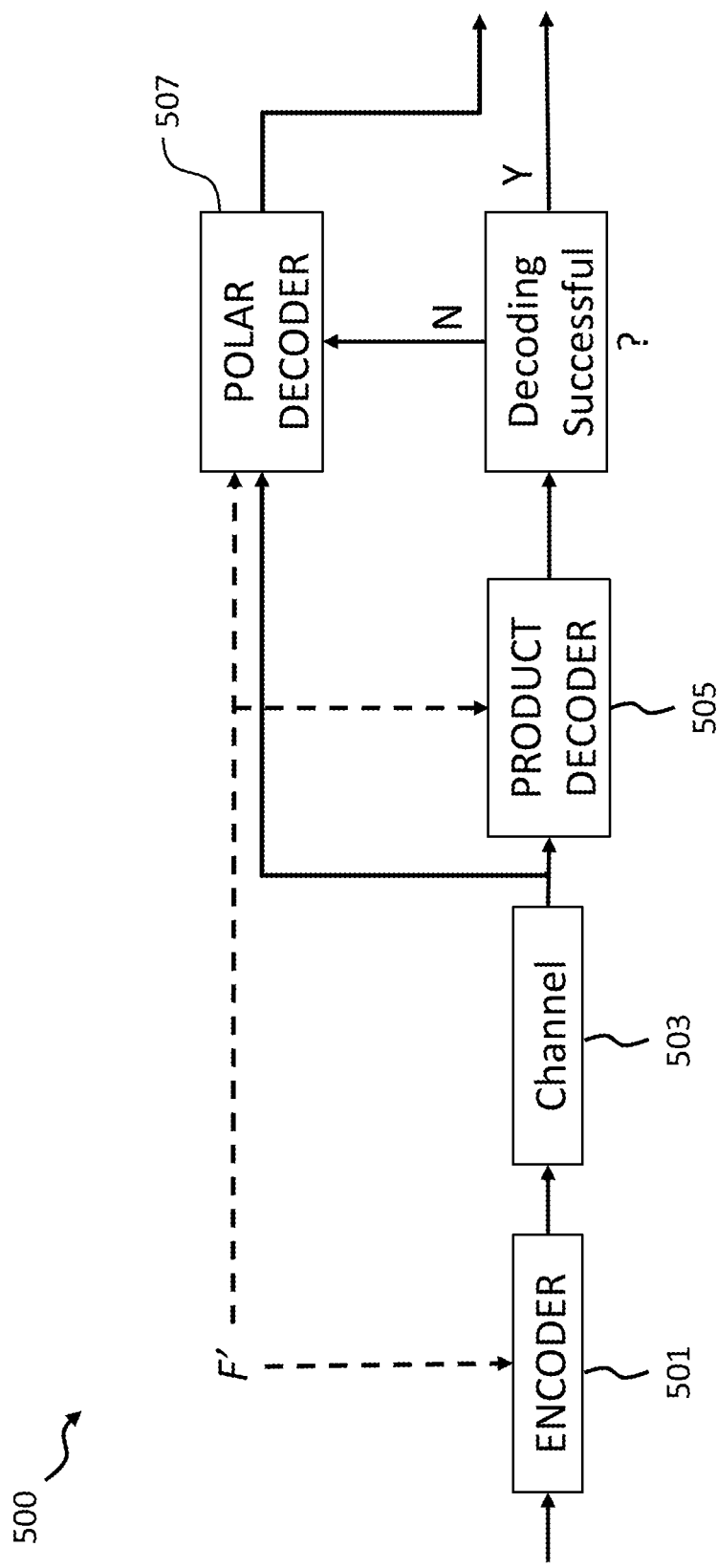
FIG. 5 shows a schematic diagram illustrating a communication system comprising an encoder, a communication channel, a product code decoder according to an embodiment and a polar code decoder according to an embodiment.

In an embodiment, a modified transmission system, which shows the use of the newly designed frozen set F' and the new decoding architecture, is portrayed in FIG. 5 and will be further discussed blow. Details of the new frozen set design, which may be done on-the-fly or offline, are explained below under reference to FIG. 4.

FIG. 4 shows a schematic diagram illustrating a mapping apparatus 401 according to an embodiment for generating a frozen vector associated with a polar code codeword on the basis of a frozen matrix associated with a product code codeword, and also a mapping apparatus 411 according to an embodiment for generating a frozen matrix associated with a product code codeword on the basis of a frozen vector associated with a polar code codeword. The frozen matrix is of size $N_c \times N_r$ and comprises a plurality of bits. The product code codeword comprises a matrix of size $N_c \times N_r$. The frozen vector comprises a vector of size N with a plurality of bits.

As can be taken from FIG. 4, the mapping apparatus 401 comprises a processing unit 403 configured: to replicate a first matrix row of the frozen matrix $N_c$ times to generate an expanded matrix row; replicate a first matrix column of the frozen matrix $N_r$ times to generate an expanded matrix column; and generate the frozen vector on the basis of the expanded matrix row and the expanded matrix column, wherein a respective bit value of the frozen vector equals 1 if a respective corresponding bit of the expanded matrix row or a further respective corresponding bit of the expanded matrix column equals 1 and, otherwise, the respective bit value of the frozen vector equals 0.

In an embodiment, the processing unit 403 can change at least one bit of the frozen vector that is not frozen into a frozen bit, wherein the at least one bit of the frozen vector is at a position at which a reliability of a corresponding bit of the polar code codeword is lower than a predetermined threshold value, for instance, the corresponding bit of the polar code codeword is the least reliable. The relative reliability of bits can be computed according to different methods, including but not limited to Monte Carlo simulations, Gaussian Approximation, and Battacharyya parameter, as shown in, for example, E. Arikan, "Channel polarization: A method for constructing capacity achieving codes for symmetric binary-input memoryless channels," IEEE Transactions on Information Theory, vol. 55, no. 7, pp. 3051, July 2009. Similarly, the processing unit 403 can further change at least one further bit of the frozen vector that is frozen into an information bit, wherein the at least one further bit of the frozen vector is at a position at which a reliability of a corresponding bit of the polar code codeword is higher than a predetermined threshold value.

According to an embodiment, an example of mapping the frozen set from product code to polar code is provided below, assuming that each row component code of a product polar code has a frozen set $F_r$ and each column component code has a frozen set $F_c$. While a frozen set can be represented by the list of the bit indices of frozen bits, it is useful to represent $F_r$ ($F_c$) as a vector of $N_r$ ($N_c$) bits with a 0 if the corresponding bit is an information bit, and a 1 if the bit is frozen.

For the sake of simplicity, every row component code is assumed to have the same frozen set $F_r$ in this example, and every column component code has frozen set $F_c$. The following can be generalized in case of different frozen sets.

To obtain the frozen set F of the N-bit polar code from $F_r$ and $F_c$, the following steps need to be performed: First of all, $F_r$ is expanded into the N-bit $F_r$-exp replicating $F_r$ $N_c$ times. For example, in case $N_r$ is equal to 4, $N_c$ is equal to 4, and $F_r$ is [1, 1, 0, 0], then $F_r$-exp is [1,1,0,0,1,1,0,0,1,1,0,0,1,1,0,0].

Secondly, $F_c$ is expanded into the N-bit $F_c$-exp replicating the first bit of $F_c$ $N_r$ times, then the second bit of $F_c$ $N_r$ times, and so on. For example, in case $N_r$ is equal to 4, $N_c$ is equal to 4, and $F_c$ is [1, 1, 0, 0], then $F_c$-exp is [1,1,1,1,1,1,1,1,0,0,0,0,0,0,0,0].

Finally, F as $F_r$-exp or $F_c$-exp can be obtained meaning that F has a bit value of 1 where either $F_r$-exp or $F_c$-exp have a bit value of 1. Given that $F_r$-exp=[1,1,0,0,1,1,0,0,1,1,0,0,1,1,0,0] and $F_c$-exp=[1,1,1,1,1,1,1,1,0,0,0,0,0,0,0,0], then F=[1,1,1,1,1,1,1,1,1,0,0,1,1,0,0].

The selection of $F_r$ and $F_c$ is independent of the described mapping.

As for mapping the frozen set from polar code to product code, the mapping apparatus 411 in FIG. 4 can generate a frozen matrix associated with a product code codeword on the basis of a frozen vector associated with a polar code codeword, wherein the product code codeword comprises a matrix of size $N_c \times N_r$ and the frozen vector comprises a vector of size N with a plurality of bits.

As can be taken from FIG. 4, the mapping apparatus 411 further comprises a processing unit 413 configured to: generate a first vector of size $N_r$, wherein the first vector comprises a bit with a value of 1 at position k and multiple bits with a value of 0 at the other positions; and expand the first vector on the basis of the $i^{th}$ row of a transpose of a transformation matrix associated with the polar-code codeword to generate a first expanded vector, wherein the transformation matrix is of size $N_c \times N_c$. In an embodiment, the processing unit 413 is configured to expand the first vector by multiplying the first vector with each bit of the $i^{th}$ row of the transpose of the transformation matrix.

Next, the processing unit 413 can determine a bit value of the frozen matrix at position k for the $i^{th}$ row on the basis of the first expanded vector and the frozen vector, wherein the bit value of the frozen matrix at position k for the $i^{th}$ row is a frozen bit, if, for each bit of the first expanded vector that comprises a bit value of 1, a respective corresponding bit of the frozen vector also equals 1.

Moreover, the processing unit 413 is further configured to: generate a second vector of size $N_c$, wherein the second vector comprises a bit with a value of 1 at position k and multiple bits with a value of 0 at the other positions; and expand the second vector on the basis of the $j^{th}$ row of a transpose of a further transformation matrix associated with the polar-code codeword to generate a second expanded vector, by multiplying the $j^{th}$ row of the transpose of the further transformation matrix with each bit of the second vector, wherein the further transformation matrix is of size $N_r \times N_r$.

Finally, the processing unit 413 determines a bit value of the frozen matrix at position k for the $j^{th}$ column on the basis of the second expanded vector and the frozen vector, wherein the bit value of the frozen matrix at position k for the $j^{th}$ column is a frozen bit, if, for each bit of the second expanded vector that comprises a bit value of 1, a respective corresponding bit of the frozen vector also equals 1.

In a further embodiment, the processing unit 413 can change at least one bit of the frozen matrix that is not frozen into a frozen bit, wherein the at least one bit of the frozen matrix is at a position at which a reliability of a corresponding bit of the product code codeword is lower than a predetermined threshold value. Also, the processing unit 413 can further change at least one further bit of the frozen matrix that is frozen into an information bit, wherein the at least one further bit of the frozen matrix is at a position at which a reliability of a corresponding bit of the product code codeword is higher than a predetermined threshold value.

More specifically, an example of mapping the frozen set from polar code to product code is provided below, assuming that a polar code has a frozen set F, represented as the N-bit binary vector described previously. Given the product code representation of said code, $F_r^i$ and $F_c^j$ can be defined as the inferred frozen set of for row i and column j respectively. Also, T is defined as the transformation matrix for the N-bit polar code, and $T^t$ as its transpose.

To identify $F_r^i$ the following steps need to be performed for all $N_r$ bits, for $1 \leq i \leq N_c$: first, to check if bit $1 \leq k \leq N_r$ of $F_r^i$ is a frozen bit given F, building the $N_r$-bit vector $b_k^i$ that has a single 1 at the k-th bit. For example, with i=1, k=4, $N_r$=8, then $b_4^1$=[0,0,0,1,0,0,0,0].

A second step is expanding $b_k^i$ into the N-bit b $\exp_k^i$, by replicating $b_k^i$ $N_c$ times according to the 1s in the i-th row of $T^t$. For example, given $b_2^3$=[0,1,0,0] and the third row of $T^t$ being [1,0,0,1], then b $\exp_k^i$=[0,1,0,0,0,0,0,0,0,0,0,0,0,1,0,0].

A third step is comparing b $\exp_k^i$ and F: bit k in $F_r$ is a frozen bit if, given the indices for which the entries of b $\exp_k^i$ are 1, also F has 1s. For example, given b $\exp_2^3$=[0,1,0,0,0,0,0,0,0,0,0,0,0,1,0,0] and F=[1,1,0,0,1,0,0,1,0,0,0,0,1,1,1,1], then bit 2 in $F_r^3$ is a frozen bit, since all the 1s in b $\exp_2^3$ are also is in F.

To identify $F_c^j$ the following steps need to be performed for all $N_c$ bits, for $1 \leq i \leq N_c$: first, to check if bit $1 \leq k \leq N_c$ of $F_c^j$ is a frozen bit given F, building the $N_c$-bit vector $b_k^j$ that has a single 1 at the k-th bit. For example, with i=1, k=4, $N_c$=8, then $b_4^1$=[0,0,0,1,0,0,0,0].

A second step is expanding $b_k^j$ into the N-bit b $\exp_k^j$, by replicating the jth row of $T^t$ $N_c$ times according to the 1s in $b_k^j$. For example, given $b_2^3$=[0,1,0,0] and the third row of $T^t$ being [1,0,0,1], then b $\exp_k^j$=[0,0,0,0,1,0,0,1,0,0,0,0,0,0,0,0].

A third step is comparing b $\exp_k^j$ and F: bit k in $F_c$ is a frozen bit if, given the indices for which the entries of b $\exp_k^j$ are 1, also F has 1s. For example, given b $\exp_2^3$= [0,0,0,0,1,0,0,1,0,0,0,0,0,0,0,0] and F=[1,1,0,0,1,0,0,1,0, 0,0,0,1,1,1,1], then bit 2 in $F_c^3$ is a frozen bit, since all the 1s in b $\exp_2^3$ are also is in F.

The selection of F is independent of the described mapping.

Given the mappings described above, two limited frozen set selection cases may be identified: a first case that $F_r$ and $F_c$ are selected and F is inferred; a second case in which F is selected, $F_r$ and $F_c$ are inferred.

According to an embodiment, the two design approaches can be merged. Considering R as the desired rate of the length-N polar code, and the rate of the row and column component codes as $R_r$ and $R_c$, wherein $R_r \times R_c \geq R$, as a first step, $F_r$ and $F_c$ are designed targeting optimal polar decoding of length-$N_r$ and length-$N_c$ polar codes. The inferred F has a rate of $R_r \times R_c$: if $R_r \times R_c > R$, the remainder of the frozen bit positions needed to achieve R is set as the least reliable positions of the length-N polar code that are not frozen in the inferred frozen set. The difference between $R_r \times R_c$ and R allows for trade-off latency and performance when the two decoding approaches are combined.

FIG. 5 shows a schematic diagram illustrating a communication system 500 comprising an encoder 501, a communication channel 503, a product code decoder 505 according to an embodiment and a polar code decoder 507 according to an embodiment. The modified transmission system 500 in FIG. 5 shows the use of the newly designed frozen set F' and the new decoding architecture as already discussed above.

In an embodiment, the product code decoder 505 for decoding a product code codeword comprises: the mapping apparatus 401 as shown above for generating a frozen vector associated with a polar code codeword on the basis of a frozen matrix associated with the product code codeword; and a decoding unit configured to decode the product code codeword on the basis of the frozen vector associated with the polar code codeword using a polar code decoding scheme.

In an embodiment, the polar code decoder 507 for decoding a polar code codeword comprises: the mapping apparatus 411 as shown above for generating a frozen matrix associated with a product code codeword on the basis of a frozen vector associated with the polar code codeword; and a decoding unit configured to decode the polar code codeword on the basis of the frozen matrix associated with the product code codeword using a product code decoding scheme.

Embodiments of the disclosure can provide three decoding approaches, which are based on the observation that a polar code codeword can be split into rows of a product code with row and column polar component codes, and vice versa.

First, a polar product code can be decoded with polar code decoding algorithms. Secondly, a polar code can be decoded with product code decoding algorithms. Thirdly, a hybrid decoding approach can be performed by the following steps: a first step of considering the code as a product code and applying product-code decoding, i.e. iterative decoding of the row and column polar component codes and exchanging of information between the two phases; a second step of considering the code as a single polar code of length N and applying polar decoding in case errors are left after the first step.

The first decoding step as mentioned above allows the parallelization of polar code decoding process, reducing latency. Implementation complexity can be tuned depending on the number of parallel component code decoders instantiated. The second decoding step improves the error-correction performance by strengthening the decoding process with the decoding of a longer code. It is activated with a probability γ. As channel conditions improve, γ tends to be 0, thus having negligible impact on the average decoding latency. To limit the implementation complexity of the second step, the same decoding algorithm can be used for the second step and also for the component codes at the first step, thus maximizing resource sharing.

Figure 6:
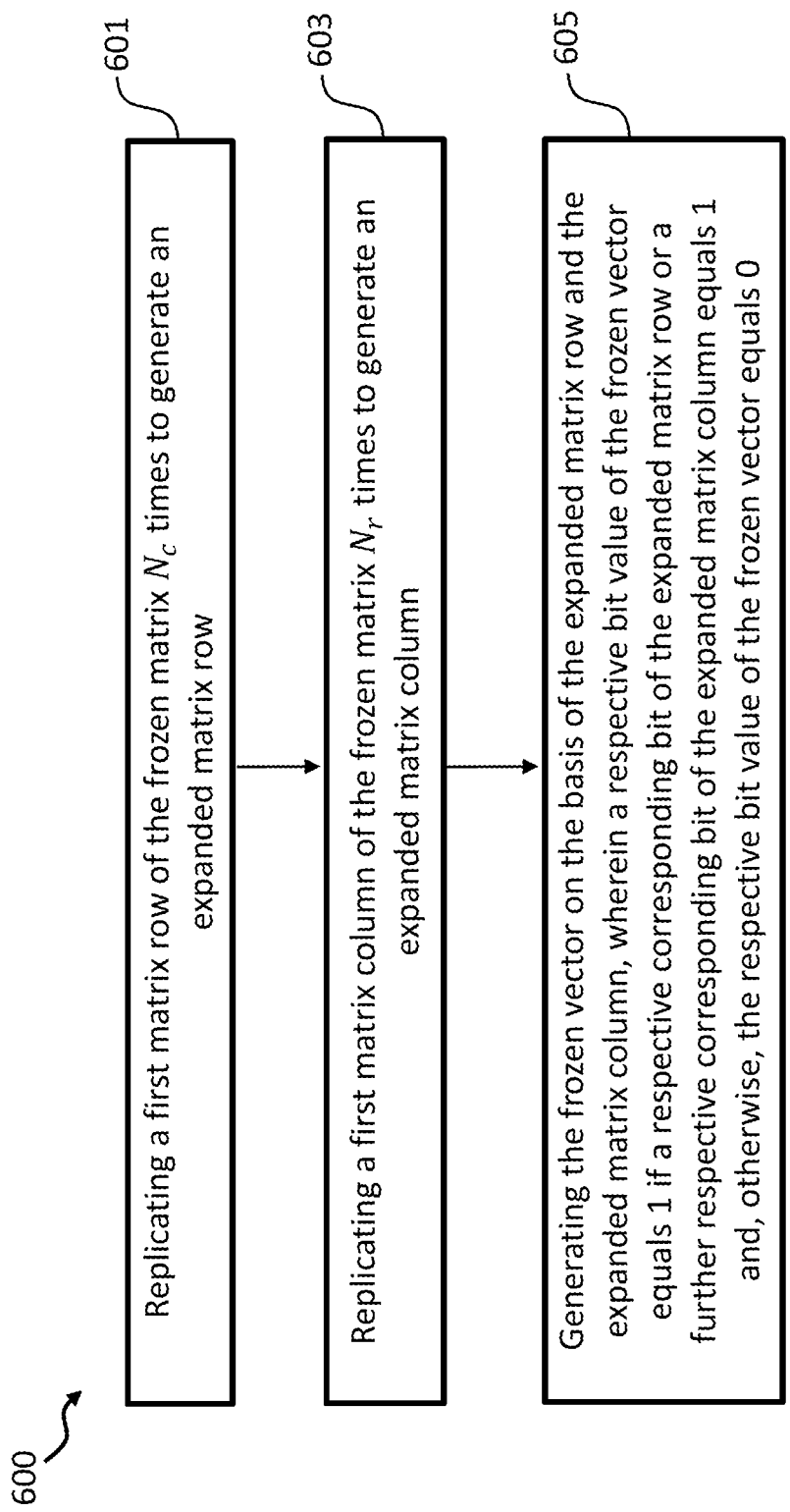
FIG. 6 shows a schematic diagram illustrating a method of generating a frozen vector associated with a polar code codeword according to an embodiment.

FIG. 6 shows a schematic diagram illustrating a method 600 for generating a frozen vector associated with a polar code codeword on the basis of a frozen matrix associated with a product code codeword, wherein the frozen matrix is of size $N_c \times N_r$ and comprises a plurality of bits.

The method 600 comprises the following steps: a first step 601 of replicating a first matrix row of the frozen matrix $N_c$ times to generate an expanded matrix row; a second step 603 of replicating a first matrix column of the frozen matrix $N_r$ times to generate an expanded matrix column; and a third step 605 of generating the frozen vector on the basis of the expanded matrix row and the expanded matrix column, wherein a respective bit value of the frozen vector equals 1 if a respective corresponding bit of the expanded matrix row or a further respective corresponding bit of the expanded matrix column equals 1 and, otherwise, the respective bit value of the frozen vector equals 0.

Figure 7:
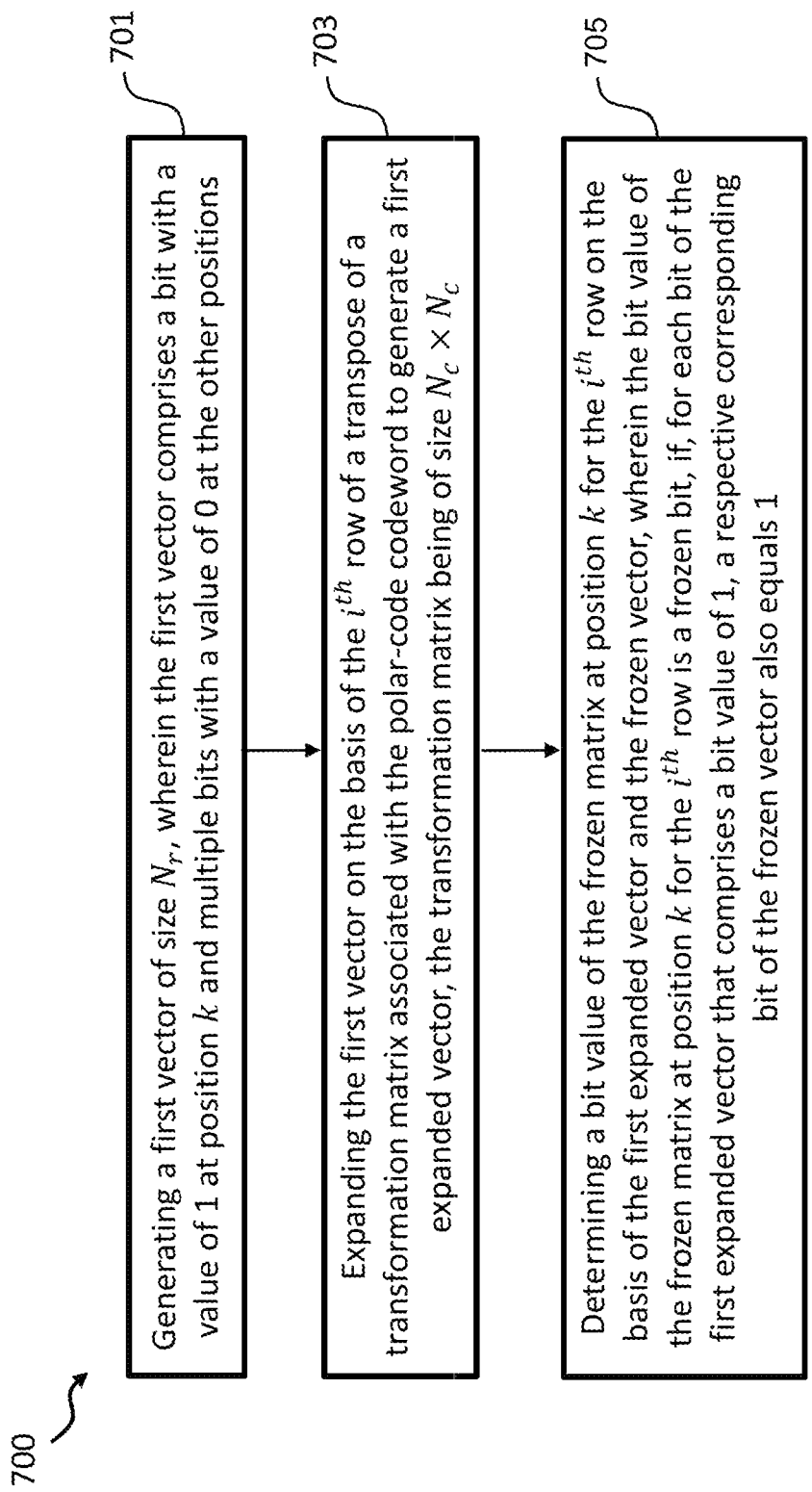
FIG. 7 shows a schematic diagram illustrating a method of generating a frozen matrix associated with a product code codeword according to an embodiment.

FIG. 7 shows a schematic diagram illustrating a method 700 for generating a frozen matrix associated with a product code codeword on the basis of a frozen vector associated with a polar code codeword, wherein the product code codeword comprises a matrix of size $N_c \times N_r$ and wherein the frozen vector comprises a vector of size N with a plurality of bits.

The method 700 comprises the following steps: a first step 701 of generating a first vector of size $N_r$, wherein the first vector comprises a bit with a value of 1 at position k and multiple bits with a value of 0 at the other positions; a second step 703 of expanding the first vector on the basis of the $i^{th}$ row of a transpose of a transformation matrix associated with the polar-code codeword to generate a first expanded vector, the transformation matrix being of size $N_c \times N_c$; and a third step 705 of determining a bit value of the frozen matrix at position k for the $i^{th}$ row on the basis of the first expanded vector and the frozen vector, wherein the bit value of the frozen matrix at position k for the $i^{th}$ row is a frozen bit, if, for each bit of the first expanded vector that comprises a bit value of 1, a respective corresponding bit of the frozen vector also equals 1.

In a further embodiment, the method 700 comprises more steps as follows: a step of generating a second vector of size $N_c$, wherein the second vector comprises a bit with a value of 1 at position k and multiple bits with a value of 0 at the other positions; a step of expanding the second vector on the basis of the $j^{th}$ row of a transpose of a further transformation matrix associated with the polar-code codeword to generate a second expanded vector, the further transformation matrix being of size $N_r \times N_r$; and a step of determining a bit value of the frozen matrix at position k for the $j^{th}$ column on the basis of the second expanded vector and the frozen vector, wherein the bit value of the frozen matrix at position k for the $j^{th}$ column is a frozen bit, if, for each bit of the second expanded vector that comprises a bit value of 1, a respective corresponding bit of the frozen vector also equals 1.

While a particular feature or aspect of the disclosure may have been disclosed with respect to only one of several implementations or embodiments, such feature or aspect may be combined with one or more other features or aspects of the other implementations or embodiments as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the terms "exemplary", "for example" and "e.g." are merely meant as an example, rather than the best or optimal. The terms "coupled" and "connected", along with derivatives may have been used. It should be understood that these terms may have been used to indicate that two elements cooperate or interact with each other regardless whether they are in direct physical or electrical contact, or they are not in direct contact with each other.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

Many alternatives, modifications, and variations will be apparent to those skilled in the art in light of the above teachings. Of course, those skilled in the art readily recognize that there are numerous applications of the disclosure beyond those described herein. While the present disclosure has been described with reference to one or more particular embodiments, those skilled in the art recognize that many changes may be made thereto without departing from the scope of the present disclosure. It is therefore to be understood that within the scope of the appended claims and their equivalents, the disclosure may be practiced otherwise than as specifically described herein.

What is claimed is:

1. A method for generating a frozen vector associated with a polar code codeword on the basis of a frozen matrix associated with a product code codeword, the frozen matrix being of size $N_r \times N_r$, the frozen matrix comprising a plurality of bits, the method comprising:
   replicating a first matrix row of the frozen matrix $N_c$, times to generate an expanded matrix row;
   replicating a first matrix column of the frozen matrix $N_r$, times to generate an expanded matrix column;
   generating the frozen vector on the basis of the expanded matrix row and the expanded matrix column, wherein a bit value of the frozen vector equals 1 in response to a corresponding bit of the expanded matrix row or a further corresponding bit of the expanded matrix column equaling 1 and, otherwise, the bit value of the frozen vector equals 0; and
   encoding a data based on the frozen vector.

2. The method of claim 1, further comprising:
   changing at least one bit of the frozen vector that is not frozen into a frozen bit, wherein the at least one bit of the frozen vector is at a position at which a reliability of a corresponding bit of the polar code codeword is lower than a predetermined threshold value.

3. The method of claim 1, further comprising:
changing at least one further bit of the frozen vector that is frozen into an information bit, wherein the at least one further bit of the frozen vector is at a position at which a reliability of a corresponding bit of the polar code codeword is higher than a predetermined threshold value.

4. The method of claim 1, further comprising:
decoding the product code codeword on the basis of the frozen vector associated with the polar code codeword using a polar code decoding scheme.

5. A method for generating a frozen matrix associated with a product code codeword on the basis of a frozen vector associated with a polar code codeword, the product code codeword comprising a matrix of size $N_r \times N_r$, the frozen vector comprising a vector of size N, the vector comprising a plurality of bits, the method comprising:
generating a first vector of size $N_r$, wherein the first vector comprises a bit with a value of 1 at position k and multiple bits with a value of 0 at the other positions;
expanding the first vector on the basis of the $i^{th}$ row of a transpose of a transformation matrix associated with the polarl code codeword to generate a first expanded vector, the transformation matrix being of size $N_r \times N_r$;
determining a bit value of the frozen matrix at position k for the $i^{th}$ row on the basis of the first expanded vector and the frozen vector, wherein the bit value of the frozen matrix at position k for the $i^{th}$ row is a frozen bit, in response to, for each bit of the first expanded vector that comprises a bit value of 1, a corresponding bit of the frozen vector also equaling 1; and
encoding a data based on the frozen matrix.

6. The method of claim 5, further comprising:
expanding the first vector by multiplying the first vector with each bit of the $i^{th}$ row of the transpose of the transformation matrix.

7. The method of claim 5, further comprising:
generating a second vector of size $N_c$, wherein the second vector comprises a bit with a value of 1 at position k and multiple bits with a value of 0 at the other positions;
expanding the second vector on the basis of the $j^{th}$ row of a transpose of a further transformation matrix associated with the polar code codeword to generate a second expanded vector, the further transformation matrix being of size $N_r \times N_r$; and
determining a bit value of the frozen matrix at position k for the $j^{th}$ column on the basis of the second expanded vector and the frozen vector, wherein the bit value of the frozen matrix at position k for the $j^{th}$ column is a frozen bit, in response to, for each bit of the second expanded vector that comprises a bit value of 1, a corresponding bit of the frozen vector also equaling 1.

8. The method of claim 7, further comprising:
expanding the second vector to generate the second expanded vector by multiplying the $j^{th}$ row of the transpose of the further transformation matrix with each bit of the second vector.

9. The method of claim 5, further comprising:
changing at least one bit of the frozen matrix that is not frozen into a frozen bit, wherein the at least one bit of the frozen matrix is at a position at which a reliability of a corresponding bit of the product code codeword is lower than a predetermined threshold value.

10. The method of claim 5, further comprising:
changing at least one further bit of the frozen matrix that is frozen into an information bit, wherein the at least one further bit of the frozen matrix is at a position at which a reliability of a corresponding bit of the product code codeword is higher than a predetermined threshold value.

11. The method of claim 5, further comprising:
decoding the polar code codeword on the basis of the frozen matrix associated with the product code codeword using a product code decoding scheme.

12. A non-transitory computer-readable medium, having computer-executable instructions stored thereon for performing a method for generating a frozen matrix associated with a product code codeword on the basis of a frozen vector associated with a polar code codeword, the product code codeword comprising a matrix of size $N_r \times N_r$, the frozen vector comprising a vector of size N, the vector comprising a plurality of bits, the computer-executable instructions, when executed by one or more processors, cause a processor to facilitate:
generating a first vector of size $N_r$, wherein the first vector comprises a bit with a value of 1 at position k and multiple bits with a value of 0 at the other positions;
expanding the first vector on the basis of the $i^{th}$ row of a transpose of a transformation matrix associated with the polar code codeword to generate a first expanded vector, the transformation matrix being of size $N_r \times N_r$;
determining a bit value of the frozen matrix at position k for the $i^{th}$ row on the basis of the first expanded vector and the frozen vector, wherein the bit value of the frozen matrix at position k for the $i^{th}$ row is a frozen bit, if in response to, for each bit of the first expanded vector that comprises a bit value of 1, a respective corresponding bit of the frozen vector also equaling 1; and
encoding a data based on the frozen matrix.

13. The non-transitory computer-readable medium of claim 12, wherein the processor executes the instructions to further facilitate:
expanding the first vector by multiplying the first vector with each bit of the $i^{th}$ row of the transpose of the transformation matrix.

14. The non-transitory computer-readable medium of claim 12, wherein the processor executes the instructions to further facilitate:
generating a second vector of size $N_c$, wherein the second vector comprises a bit with a value of 1 at position k and multiple bits with a value of 0 at the other positions;
expanding the second vector on the basis of the $j^{th}$ row of a transpose of a further transformation matrix associated with the polar code codeword to generate a second expanded vector, the further transformation matrix being of size $N_r \times N_r$; and
determining a bit value of the frozen matrix at position k for the $j^{th}$ column on the basis of the second expanded vector and the frozen vector, wherein the bit value of the frozen matrix at position k for the $j^{th}$ column is a frozen bit, if in response to, for each bit of the second expanded vector that comprises a bit value of 1, a corresponding bit of the frozen vector also equaling 1.

15. The non-transitory computer-readable medium of claim 14, wherein the processor executes the instructions to further facilitate:
expanding the second vector to generate the second expanded vector by multiplying the $j^{th}$ row of the transpose of the further transformation matrix with each bit of the second vector.

16. The non-transitory computer-readable medium of claim 12, wherein the processor executes the instructions to further facilitate:
changing at least one bit of the frozen matrix that is not frozen into a frozen bit, wherein the at least one bit of the frozen matrix is at a position at which a reliability of a corresponding bit of the product code codeword is lower than a predetermined threshold value.

17. The non-transitory computer-readable medium of claim 12, wherein the processor executes the instructions to further facilitate:
changing at least one further bit of the frozen matrix that is frozen into an information bit, wherein the at least one further bit of the frozen matrix is at a position at which a reliability of a corresponding bit of the product code codeword is higher than a predetermined threshold value.

18. The non-transitory computer-readable medium of claim 12, wherein the processor executes the instructions to further facilitate:
decoding the polar code codeword on the basis of the frozen matrix associated with the product code codeword using a product code decoding scheme.

* * * * *

UNITED STATES PATENT AND TRADEMARK OFFICE
CERTIFICATE OF CORRECTION

PATENT NO. : 11,323,139 B2
APPLICATION NO. : 17/201891
DATED : May 3, 2022
INVENTOR(S) : Condo et al.

It is certified that error appears in the above-identified patent and that said Letters Patent is hereby corrected as shown below:

On the Title Page

Page 2: item (56) Other Publications, Column 1, Line 2: "Capacity-Achieving Codes for Symmetric Binary-nput Memoryless" should read -- Capacity-Achieving Codes for Symmetric Binary-Input Memoryless --.

In the Claims

Claim 1: Column 12, Line 48: "being of size $N_r \times N_r$, the frozen matrix comprising a plurality" should read -- being of size $N_c \times N_r$, the frozen matrix comprising a plurality --.

Claim 5: Column 13, Line 15: "codeword comprising a matrix of size $N_r \times N_r$, the frozen" should read -- codeword comprising a matrix of size $N_c \times N_r$, the frozen --.

Claim 5: Column 13, Lines 23 and 24: "the polarl code codeword to generate a first expanded vector, the transformation matrix being of size $N_r \times N_r$;" should read -- the polar code codeword to generate a first expanded vector, the transformation matrix being of size $N_c \times N_c$; --.

Claim 12: Column 14, Line 15: "codeword comprising a matrix of size $N_r \times N_r$, the frozen" should read -- codeword comprising a matrix of size $N_c \times N_r$, the frozen --.

Claim 12: Column 14, Line 26: "vector, the transformation matrix being of size $N_r \times N_r$;" should read -- vector, the transformation matrix being of size $N_c \times N_c$; --.

Signed and Sealed this
Eleventh Day of October, 2022

Katherine Kelly Vidal
*Director of the United States Patent and Trademark Office*